United States Patent [19]
Aspar et al.

[11] Patent Number: 6,103,597
[45] Date of Patent: *Aug. 15, 2000

[54] METHOD OF OBTAINING A THIN FILM OF SEMICONDUCTOR MATERIAL

[75] Inventors: Bernard Aspar, Rives; Béatrice Biasse, Uriage; Michel Bruel, Veurey, all of France

[73] Assignee: Commissariat a l'Energie Atomique, France

[ * ] Notice: This patent issued on a continued prosecution application filed under 37 CFR 1.53(d), and is subject to the twenty year patent term provisions of 35 U.S.C. 154(a)(2).

[21] Appl. No.: 08/834,035
[22] Filed: Apr. 11, 1997

[30] Foreign Application Priority Data

Apr. 11, 1996 [FR] France ................... 96 04517

[51] Int. Cl.$^7$ .................................................. H01L 21/30
[52] U.S. Cl. .......................................... 438/458; 438/528
[58] Field of Search ................... 438/456–458, 438/953, 528

[56] References Cited

U.S. PATENT DOCUMENTS

| | | |
|---|---|---|
| H569 | 1/1989 | Varker et al. . |
| 5,250,446 | 10/1993 | Osawa et al. . |
| 5,374,564 | 12/1994 | Bruel . |
| 5,633,174 | 5/1997 | Li ............................................. 438/475 |

FOREIGN PATENT DOCUMENTS

| | | |
|---|---|---|
| 0533551 | 3/1993 | European Pat. Off. . |
| 0660140 | 6/1995 | European Pat. Off. . |

OTHER PUBLICATIONS

Gat et al; "Physical and electrical Properties of Laser–Annealed ion–implanted silicon"; Mar. 1, 1978; pp. 276–278; Applied Physics Letters, vol. 32, No. 5.

Greenwald et al; "Pulsed–electron–beam annealing of ion––implantation damage a)"; Feb. 1979; pp. 783–786; American Institute of Physics, vol. 50, No. 2.

*Primary Examiner*—Jey Tsai
*Attorney, Agent, or Firm*—Hayes, Soloway, Hennessey, Grossman & Hage PC

[57] ABSTRACT

A method of obtaining a thin film from a substrate made of semiconductor material, the thin film including at least one element on one face of the substrate made of a material different from the semiconductor material, and conferring to the thin film a heterogeneous structure. The method includes implantation by bombardment of the face of said substrate and said element by ions to produce gaseous microbubbles within the volume of the substrate, and to produce a continuous zone of microbubbles within said element to demarcate a region of small thickness on the side of said face of the substrate containing said element, and a region of greater thickness formed by the rest of the substrate; the ions being chosen from among the ions of rare gases or of hydrogen gas and the temperature of the substrate being kept below the temperature at which the gas generated by the implanted ions is able to escape from the semiconductor diffusion, and; a separation of the two regions situated on each side of the zone of gaseous microbubbles, by a crystalline rearrangement effect in the substrate and the effect of microbubble pressure, whereby the region of small thickness constitutes a thin film.

11 Claims, 1 Drawing Sheet

METHOD OF OBTAINING A THIN FILM OF SEMICONDUCTOR MATERIAL

BACKGROUND OF THE INVENTION

1. Field of the Invention

This invention relates to a process of obtaining a thin film of semiconductor material. The thin film is obtained by separation of a part of a substrate of small thickness in which, for example, one or several electronic components have been developed, from the rest of the substrate which has a relatively greater thickness. Depending on the application being considered, the invention also allows the transfer of the thin film from its initial substrate to another substrate or support.

2. Description of Related Art

In microelectronics, it is often sought to produce electronic components in a thin semiconductor film, supported on an insulating support or separated from its support by an electrically insulating layer. Structures called Silicon On Insulator structures are known, from which electronic components can be developed. As is known in the art, the structures can be produced as follows:

Heteroepitaxy methods, to grow a crystal, by crystalline growth, for example, of silicon in a thin film, on a monocrystalline substrate of another material whose lattice parameter is close to that of silicon, for example, a sapphire ($Al_2O_3$) or a calcium fluoride ($CaF_2$) substrate;

The method called "SIMOX" (a name currently used in the literature) which uses the ion implantation at a high dose of oxygen into a silicon substrate in order to create, in the volume of the silicon, a layer of silicon oxide separating a thin film of monocrystalline silicon from the mass of substrate;

Other methods which use the principle of the thinning down of a wafer by combined mechanical and chemical or chemical abrasion.

These various methods of producing thin semiconductor films have disadvantages linked to the manufacturing techniques.

The heteroepitaxy methods are limited by the nature of the substrate: the lattice parameter of the substrate not being exactly that of the semiconductor, or the thin film includes many crystalline defects. Furthermore, these substrates are expensive and fragile and only exist with limited dimensions.

The SIMOX method requires ion implantation at a very high dose, which requires a very heavy and complex implantation machine. The throughput of these machines is low and it is difficult to increase the throughput by an appreciable amount.

Thinning down methods are viable options, from the point of view of homogeneity and quality, only if they use the principle of a crash barrier to stop the etching, which allows the thinning down of the wafer, as soon as the required thickness has been reached, and to thereby guarantee homogeneity of thickness. Unfortunately, the creation of this crash barrier makes the process complex and can limit the use of the film in certain cases.

In order to remedy these disadvantages, FR-A-2,681,472 proposes a process for the manufacture of a thin semiconductor film and its firm attachment to a support that consists of subjecting a wafer that includes a flat face of the desired semiconductor material to the following steps:

a first implantation step by bombarding the flat face of said material with ions capable of crating, within the volume of the wafer and at a depth close to the penetration depth of said ions, a layer of gaseous microbubbles separating the wafer into a lower region constituting the mass of the substrate and an upper region constituting the thin film, the ions being chosen from among the ions of rare gases or of hydrogen gas and the temperature of the wafer being maintained below the temperature at which the gas generated by the implanted ions can escape from the semiconductor by diffusion;

a second step of bringing the flat face of the wafer into intimate contact with a support made up of at least one layer of rigid material. This intimate contact may be created, for example with an adhesive substance, or with molecular adhesion through the effect of a preliminary preparation of the surfaces and possibly of a thermal and/or electrostatic treatment in order to encourage interatomic bonding between the support and the wafer;

a third step of thermal treatment of the wafer-support assembly at a temperature over the temperature at which the implantation was carried out and sufficient to create, through a crystal rearrangement effect in the wafer and through the pressure of the microbubbles, a separation between the thin film and the mass of the substrate.

In this document, the following explanation is suggested to explain the different phenomena observed through experiment. First, the first ion implantation step is conducted by presenting a flat face of a wafer of semiconductor material to a beam of ions, the plane of this flat face being either approximately parallel to a principal crystallographic plane, in the case where the semiconductor material is perfectly monocrystalline, or more or less inclined with respect to a principal crystallographic plane with the same indices for all the grains, in the case where the material is polycrystalline.

This implantation is capable of creating a layer of gaseous microbubbles which will end up at the end of a thermal treatment as a fracture zone. This layer of microbubbles thus created within the volume of the wafer, at a depth close to the mean penetration depth of the ions two regions separated by this layer: one region constituting the thin film and one region forming the rest of the substrate. By the expression "gaseous microbubble" one skilled in the art understands this to mean any cavity or microcavity generated by the implantation of ions of hydrogen gas or rare gases in the material. The cavities may have a very flattened shape, (that is to say, of small height), for example, of the order of a few interatomic distances, or may have a roughly hemispherical shape or any other shape different from the two preceding shapes. These cavities may or may not contain a gaseous phase. During the third step, the thermal treatment is carried out at a temperature sufficient to create the fracture zone and the separation of the two regions, through a crystal rearrangement effect within the semiconductor material, such as through the effect of microcavity growth and or the effect of microbubble pressure.

According to the implantation conditions, after implantation of a gas, such as hydrogen, cavities or microbubbles are observable or not by transmission electronic microscopy. In the case of silicon, one can have microcavities, the size of which can vary from a few nm to several hundreds of nm. Hence, particularly when the implantation temperature is low, these cavities are only observable during the thermal treatment stage, a step during which a nucleation of these cavities is brought about in order to allow the fracture between the thin film and the rest of the substrate to occur at the end of the thermal treatment.

Furthermore, it appears that this method can be applied to all types of solid materials, crystalline or not. It is possible to apply this process to dielectric materials, conductors, semi-insulators as well as to amorphous semiconductors.

The layer containing microbubbles or microcavities is a continuous layer in the sense that the microbubbles or microcavities are present in sufficient density for the interaction between the microbubbles or microcavities to occur over the whole wafer and to lead to a fracture. If the implantation is locally masked, in an intentional or a nonintentional way, for example, by a particle of the order of a $\mu$m, or less than 1 $\mu$m, the discontinuity resulting from it does not prevent propagation of the fracture.

The object of all these methods is to obtain a thin semiconductor film on a support, in order to subsequently develop electronic components in it through traditional processes. The method described in document FR-A-2,681, 472 provides a solution to the problems inherent in prior techniques. However, in order to obtain a device made up of a support coated with a thin semiconductor film in which electronic components have been developed, a step from the field of microelectronics is involved (an ion implantation step), followed by steps from the mechanical domain (a contacting step) and from the thermal domain (a heat treatment step) in order to revert to steps relating to the microelectronic field (development of electronic components).

The present invention solves these problems by grouping together, in a consecutive way, certain steps arising from the field of microelectronics, that is to say, steps that lead up to the development of all or part of the electronic components, so as to optimize the manufacture or to allow the use of substrate that comprises the original elements (for example, the electronic elements) and to subsequently define a thin film on it. In order to achieve this result, it was necessary to resolve the following problem created by the fact that the development of electronic elements in a semiconducting layer causes the creation of a heterogeneous medium, i.e., one made up of various materials (semiconductor, metals for the electrical contacts, insulators, etc.) The implanted ions are therefore distributed at different depths in relation to the surface that receives the ions. As an example, an implantation of hydrogen ions of energy 400 keV in silicon leads to the formation of microbubbles localized at a distance of about 4 $\mu$m from the surface offered to the ions. This distance is 3 $\mu$m for the same implantation in silicon having a 600 nm thick layer of tungsten on the surface (see "The stopping and Range of Ions in Solids" by J. Ziegler et al., Pergamon, New York 1985). Consequently, in the case where the treated surface has different materials in the path of the ions, the microbubbles (or microcavities) are not all localized in a layer sufficiently narrow for the interaction between the bubbles to occur over all of the surface of the wafer. The separation of the thin film from the rest of the semiconducting wafer cannot then take place in a satisfactory manner.

Another problem was created by the fact that ion implantation through electrically active layers containing different doping and insulating materials can create defects that modify the characteristics of the components or render them unusable.

The present invention solves these problems by providing ion implantation, in relation to the nature of the materials passed through by the ions, in such a manner that creates a continuous zone of microbubbles that allows a satisfactory cleavage (or fracture) between the thin film and the rest of the semiconducting wafer. Also advantageously, several implantations at different energies can be carried out. The number of implantations is then fixed by the number of materials having different characteristics with respect to implantation. Implantations at different energies allow the creation of a continuous zone of microbubbles situated at a constant depth in relation to the surface receiving the ions. As an example, for an implantation of hydrogen ions into silicon, the microbubbles must be localized in a zone whose thickness is less than 200 nm in order to permit interaction between the bubbles during the subsequent thermal treatment and to lead to the separation of the regions situated on each side of the zone containing the microbubbles, in a continuous fashion, over the whole wafer.

The present invention also provides a solution to another problem resulting from the creation of defects induced by the passage of ions through electrically active layers.

It is known that such defects can be corrected by the application of a thermal treatment. This is the subject of the reports "Physical and Electrical Properties of Laser-annealed Ion-implanted silicon" by A. Gat et al. that appeared in the journal Appl. Phys. Lett. 32 (5), 1st March 1978 and "Pulsed Electron Beam Annealing of Ion-implantation Damage" by A. C. Greenwald et al. that appeared in the journal J. Appl. Phys. 50 (2), February 1979. If it is desirable to correct defects induced in the electronic components during the implantation step by a particular heat treatment (before the separation step), this heat treatment must not affect the zone containing the microbubbles since it would cause the separation of the two regions situated on each side of this zone. Contrary to this, this annealing must heat all of the zone containing the electronic components in order to remedy the induced defects. Accordingly, the present invention provides a transient annealing step, just after the ion implantation step, to heat the damaged regions in order to remove the defects, but without heating the zone containing the microcavities.

In order to correct the defects induced by the implantation step, a total thermal treatment may also be carried out. If this treatment is carried out before the separation step, it must be carried out at an adequate temperature, but one that is less than that necessary to obtain said separation, on the whole of the structure, possibly with the support for the thin film. This heat treatment can also be carried out after the separation step, on the whole of the thin film, possibly with its support, and under these conditions, the temperature used is not critical. Finally, this heat treatment can be combined with the heat treatment necessary for the separation of the thin film from the rest of the substrate, by adapting the temperature conditions and the duration. The choice between the different possible heat treatments depends on the materials used and the components.

SUMMARY OF THE INVENTION

Therefore, an object of the invention is a method of obtaining a thin film from a substrate of semiconductor material, the thin film including at least one element in a different material from that of said semiconductor material, produced on one face of the substrate and conferring on the thin film a heterogeneous structure, characterised in that it includes the following steps:

implantation by bombardment of the face of said substrate and said element by ions to produce gaseous microbubbles within the volume of the substrate, and to produce continuous zone of microbubbles within said element to mark a region of small thickness on the side of said face of the substrate containing said element, and a region of greater thickness formed by the rest of the substrate; the ions being chosen from among the ions of rare gases or of hydrogen gas and the temperature of the substrate being kept below the temperature at which the gas generated by the implanted ions is able to escape from the semiconductor diffusion, and;

then, thermally treating the substrate at a temperature that is sufficient to create a separation of the two regions situated on each side of the zone of gaseous microbubbles, by a crystalline rearrangement effect in the substrate and the effect of microbubble pressure; whereby the region of small thickness constitutes a thin film.

With a substrate made of a semiconductor material, the part that will allow the thin film to be produced, is semiconductive. The ion implantation can be carried out in one or several successive implantations, according to the number of materials present in the substrate having a different stopping power with respect to the implanted ions. Hence for an element having the same stopping power as the substrate, an implantation in one step suffices, otherwise successive implantations are operated, the energy of the ions for each implantation being chosen in order to obtain a continuous zone of microbubbles.

The method can additionally include a heat treatment step to correct the defects induced in said element during the implantation step.

In this case, and if the heat treatment step for correcting defects induced in said element is carried out before the heat treatment step to separate said regions from the substrate, this thermal correction treatment can be localized to the zone of the substrate containing said element. This thermal correction treatment can be carried out by means of a laser beam.

The element can be all or part of an electronic component or an electrical conductor.

Alternatively, before the heat treatment step intended to separate said regions from the substrate, a step is provided in which said face of the substrate that includes said element is brought into intimate contact with a support. This bringing into contact can be carried out by any known means, for example by molecular adhesion or by the use of an adhesive substance. This support may also include all or part of at least one electronic component and/or at least one electrical conductor.

The invention will be better understood and other details and particular features will become apparent on reading the description that follows, and accompanied by the appended drawings in which:

DETAILED DESCRIPTION OF PREFERRED EMBODIMENTS

In the application example which will follow, the thin film will be fitted with an electronic component made up of three types of material: monocrystalline silicon for the active zones, silicon oxide as a dielectric and tungsten to provide the contacts. However the invention is not limited to the case of electronic components. It is also applicable to the manufacture of thin films including other elements which are, by nature, liable to modify the depth of implantation of the ions in the semiconductor material, for example, metal strips used for electrical connection between circuits or components.

Figure 1:
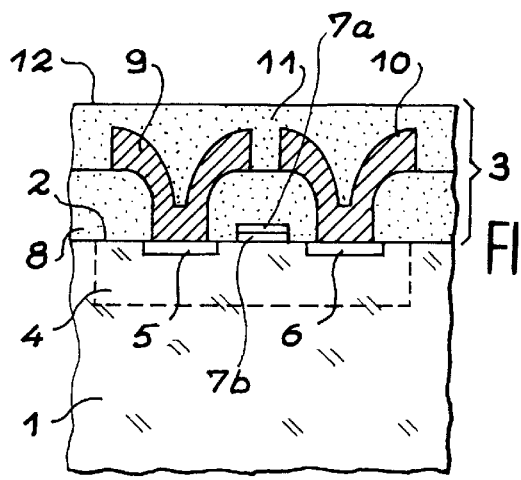
FIG. 1 is a sectional view of a semiconductor substrate on the face of which an electronic component has been produced.

FIG. 1 shows a semiconductor substrate 1 made of monocrystalline silicon, on the face 2 of which, an electronic component (a transistor 3) has been produced. The transistor 3 has been produced in accordance with techniques known in the art. There is a well 4, doped in an appropriate manner, in which a source 5 and a drain 6 have been created by doping. A gate 7a made of polycrystalline silicon and a gate oxide 7b have been formed on the face 2 of the substrate, between the source 5 and the drain 6. A layer 8 of silicon oxide has been deposited and tungsten contacts 9 and 10, respectively, for the source and the drain, have been produced through the oxide layer 8. Finally, a passivation layer 11, made of silicon oxide, has been deposited above the component 3.

Depending on the condition of the surface of the semiconductor wafer obtained, it may be necessary to carry out mechanical chemical polishing of the upper face 12 so as to obtain a degree of roughness compatible with bringing this face into contact with a face of a rigid support during a later step. In effect, the topology of the surface on electronic components can be of the order of several hundreds of nm while the surface roughness must be less than about 0.5 nm in rms roughness to ensure sticking, for example by molecular adhesion, onto the rigid support. On this subject, one may make reference to T. ABE et al., Electrochemical Society Conference, Wafer Bonding Symposium, 1990, 61.

A first ion implantation step is then carried out, involving the bombardment of the wafer by an ion beam directed onto face 12, (that is, onto face 2 of the substrate 1) as shown by the arrow. The ions which might well be implanted have been specified in document FR-A 2,681,472.

Figure 2:
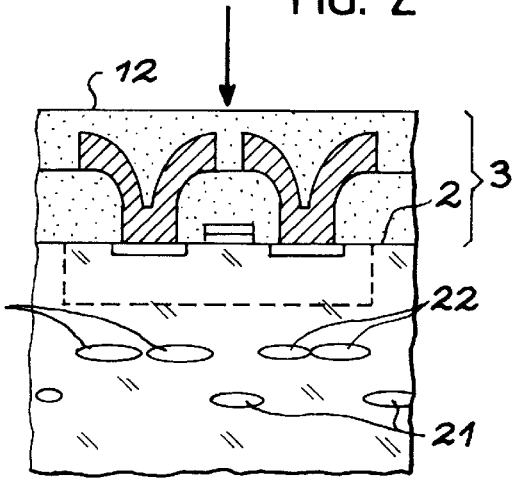
FIG. 2 illustrates the substrate of FIG. 1 during a first ion implantation step.

FIG. 2 illustrates this first ion implantation step. By using hydrogen ions of 400 keV energy, two different implantation depths are obtained. The implanted hydrogen that passes through the silicon or the silicon oxide forms microcavities 21 at 4 μm depth with respect to face 12 of the wafer. On the other hand, implanted hydrogen of the same energy which passes through the zones containing a layer of tungsten (of mean thickness 0.6 μm) forms microcavities at 3 μm depth with respect to face 12.

Figure 3:
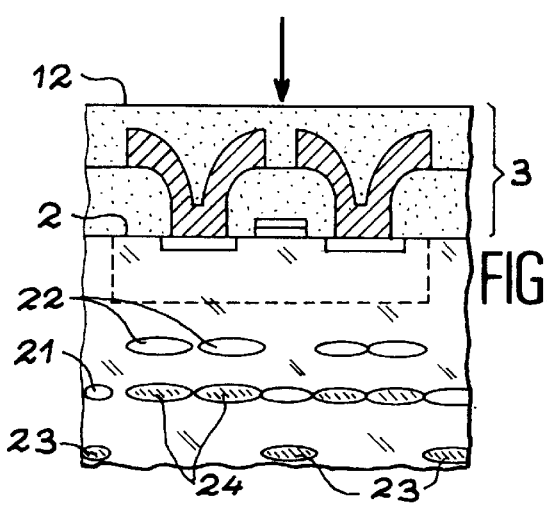
FIG. 3 illustrates the same substrate during a second ion implantation step.

It is then necessary to proceed to a second ion implantation step as illustrated in FIG. 3. An implantation of hydrogen ions of 470 keV energy, allows one to obtain a second profile of microcavities 23, 24 at a depth greater than the depth of the first profile of microcavities 21, 22. The implantation energies have been chosen in such a way that an alignment of microcavities 21 and 24 is obtained. Hence, a continuous zone of microcavities or gaseous microbubbles is obtained that provides a demarcation of an upper region which will constitute the thin film and a lower region which will form the rest of the substrate.

The number of implantation steps is a function of the number of materials behaving differently with respect to the implantation, i.e., differing mean depth of penetration in these materials.

Once the final implantation step is finished, one then proceeds, for example, to a transient annealing which only permits the zone containing the electronic component to be heated. This step is only necessary in the case where the component is disturbed by the implantation of the ions. By way of example, this annealing can be carried out by means of a laser beam directed onto the face 12, of wavelength below 0.4 μm, providing energy of 0.2 to 1 J/cm² for a period of 150 ns. Under these conditions, a temperature of the order of 800 to 900° C. can be reached for a few microseconds. These temperatures are usually sufficient to remedy the defects. This laser type annealing can be carried out only once over the entire surface of the wafer, or in several treatments, zone by zone.

Figure 4:
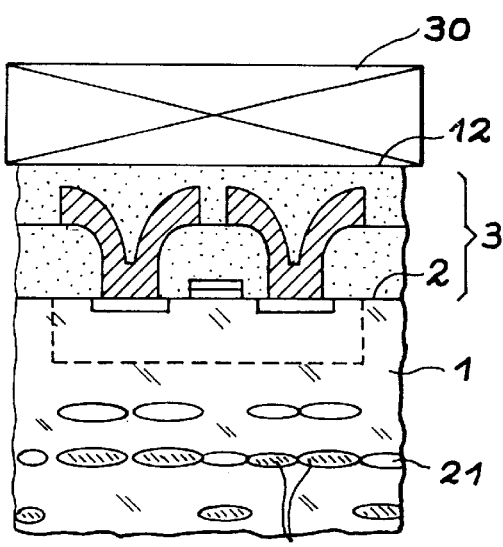
FIG. 4 represents bringing the substrate, which has been subjected to the two ion implantation steps into intimate contact with a rigid support.

FIG. 4 illustrates the step of bringing the wafer into intimate contact with a rigid support 30. This rigid support can be either a massive substrate (made, for example, of glass) or a substrate containing electronic components and/or electrical conductors. The presence of this rigid support permits the separation between the upper region of substrate 1 and the lower region as disclosed in document FR-A-2, 681,472.

However, in the case where the thickness of the thin film of semiconductor material is sufficiently great to have satisfactory rigidity, the presence of a rigid support is not necessary, and, accordingly, polishing of face 12 of the wafer is no longer necessary.

Figure 5:
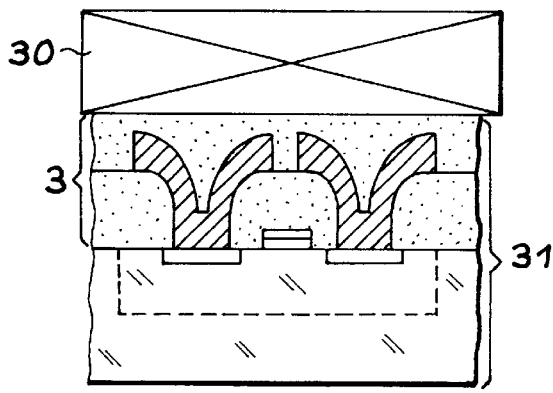
FIG. 5 shows the thin film rigidly fixed to the rigid support, such as results from the heat treatment step intended to separate the thin film from the rest of the substrate.

An isothermal heat treatment is performed which heats, in a homogeneous way, the assembly made up of the wafer and the rigid support, to a temperature greater than the temperature at which the ion bombardment is carried out and sufficient to create, through crystal rearrangement effect and through the pressure in the microbubbles, a separation of the substrate into two regions situated on each side of the continuous zone of microcavities 21, 24. Thus, as shown in FIG. 5, a thin film 31 is obtained that includes an electronic component 3 supported by a rigid support 30.

Although the example described above only mentions one electronic component, the invention is equally applicable to the creation of a thin film fitted with one or with several entirely or in part formed components.

We claim:

1. A method of obtaining a thin film from a substrate of semiconductor material, the thin film including at least one element on a part of one face of the substrate, said element being of a different material from that of said semiconductor material, and conferring on the face a heterogeneous structure, said method comprising the steps in sequence of:

implantation by bombardment of the face of said substrate and said element by ions to produce a continuous zone of microbubbles within the volume of the substrate, and adjusting said bombardment to account for said heterogeneous structure on said face, to demarcate a region of small thickness on the side of said face of the substrate containing said element, and a region of greater thickness formed by the rest of the substrate; the ions being chosen from among the ions of rare gases or of hydrogen gas and the temperature of the substrate being kept below the temperature at which the gas generated by the implanted ions is able to escape from the semiconductor by diffusion, and;

thermally treating the substrate at a temperature that is sufficient to fracture the substrate to separate the two regions situated on each side of the zone of gaseous microbubbles, by a crystalline rearrangement effect in the substrate and the effect of microbubble pressure; whereby the region of small thickness constitutes a thin film.

2. A method according to claim 1, wherein said ion implantation step further comprises successive implantations, wherein the energy of the ions for each implantation is chosen in order to obtain said continuous zone of microbubbles.

3. A method according to claim 1, further comprising a thermal treatment step to correct defects induced in said element during the implantation step.

4. A method according to claim 3, wherein said thermal treatment step for correcting defects is carried out before said thermal treatment step to separate said regions of the substrate, said thermal correction treatment step being localized to the area of substrate containing said element.

5. A method according to claim 4, wherein said thermal correction treatment step is carried out using a laser beam.

6. A method according to claim 3, wherein said thermal correction treatment of defects is carried out before the thermal treatment step to separate said regions of the substrate, said thermal correction treatment step comprising bringing the substrate to a temperature sufficient to correct the defects, said temperature being less than the temperature required to obtain the separation of said two regions.

7. A method according to claim 3, wherein said thermal correction treatment of defects is carried out after the thermal treatment step to separate the said regions of the substrate.

8. A method according to claim 3, wherein said thermal correction treatment of defects and the thermal treatment step to separate the said regions of the substrate are combined into a single thermal treatment operation.

9. A method according to claim 1, wherein said element is all or part of an electronic component or an electrical conductor.

10. A method according to claim 1, further comprising the step of bringing a support into intimate contact with said face of the substrate before said thermal treatment step.

11. A method according to claim 10, wherein said support includes all or a part of at least one electronic component and/or at least one electrical conductor.

* * * * *